(12) United States Patent
Jeong

(10) Patent No.: US 9,620,492 B2
(45) Date of Patent: Apr. 11, 2017

(54) PACKAGE-ON-PACKAGE TYPE STACK PACKAGE AND METHOD FOR MANUFACTURING THE SAME

(71) Applicant: SK hynix Inc., Icheon-si Gyeonggi-do (KR)

(72) Inventor: Jung Tae Jeong, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 55 days.

(21) Appl. No.: 14/729,611

(22) Filed: Jun. 3, 2015

(65) Prior Publication Data

US 2016/0225743 A1 Aug. 4, 2016

(30) Foreign Application Priority Data

Feb. 4, 2015 (KR) .................. 10-2015-0017066

(51) Int. Cl.
*H01L 25/065* (2006.01)
*H01L 25/00* (2006.01)
(Continued)

(52) U.S. Cl.
CPC ............ *H01L 25/50* (2013.01); *H01L 21/486* (2013.01); *H01L 21/4853* (2013.01); *H01L 21/4889* (2013.01); *H01L 23/49816* (2013.01); *H01L 23/49827* (2013.01); *H01L 23/49838* (2013.01); *H01L 25/105* (2013.01);
(Continued)

(58) Field of Classification Search
CPC ............... H01L 25/0657; H01L 25/50; H01L 23/49816; H01L 23/49827; H01L 23/49838; H01L 21/4853; H01L 21/486; H01L 21/4889; H01L 2225/06506;
(Continued)

(56) References Cited

U.S. PATENT DOCUMENTS 6,232,561 B1* 5/2001 Schmidt .................. H01L 24/05
174/260
6,294,830 B1* 9/2001 Fjelstad .............. H01L 21/4832
257/684
(Continued)

FOREIGN PATENT DOCUMENTS

KR 1020120133651 A 12/2012

*Primary Examiner* — Victoria K Hall
(74) *Attorney, Agent, or Firm* — William Park & Associates Ltd.

(57) ABSTRACT

A bottom package having a first semiconductor chip and first connection members; and a top package disposed over the bottom package, and having a second semiconductor chip and second connection members electrically coupled with the first connection members. The bottom package includes an interposer having electrodes arranged along edges; first bond fingers arranged by being separated from the edges of the interposer; a first semiconductor chip disposed over the interposer to expose the electrodes, and having first bonding pads; first bonding wires electrically coupling the first bonding pads and the electrodes; second bonding wires electrically coupling the electrodes and the first bond fingers; and a first encapsulation member formed to cover the first bond fingers, the upper and side surfaces of the interposer and the first semiconductor chip, and the first and second bonding wires, and having via holes which expose portions of the second bonding wires.

17 Claims, 6 Drawing Sheets

(51) Int. Cl.
*H01L 23/498* (2006.01)
*H01L 21/48* (2006.01)
*H01L 25/10* (2006.01)
*H01L 23/31* (2006.01)
*H01L 21/56* (2006.01)

(52) U.S. Cl.
CPC ........ *H01L 21/568* (2013.01); *H01L 23/3128* (2013.01); *H01L 2224/04042* (2013.01); *H01L 2224/32225* (2013.01); *H01L 2224/48091* (2013.01); *H01L 2224/48227* (2013.01); *H01L 2224/73265* (2013.01); *H01L 2224/85005* (2013.01); *H01L 2224/92247* (2013.01); *H01L 2225/1023* (2013.01); *H01L 2225/1058* (2013.01); *H01L 2225/1082* (2013.01); *H01L 2225/1088* (2013.01); *H01L 2924/00014* (2013.01); *H01L 2924/1431* (2013.01); *H01L 2924/1434* (2013.01); *H01L 2924/15311* (2013.01); *H01L 2924/181* (2013.01); *H01L 2924/1815* (2013.01); *H01L 2924/19107* (2013.01)

(58) Field of Classification Search
CPC ... H01L 2225/0651; H01L 2225/06544; H01L 2225/06513
USPC ....... 257/106, 107, 127, 613, 614, 617, 652, 257/666; 438/738, 773, 774
See application file for complete search history.

(56) References Cited

U.S. PATENT DOCUMENTS

| | | | |
|---|---|---|---|
| 6,545,363 B2 * | 4/2003 | Maruyama | G01R 1/06711 257/773 |
| 7,750,465 B2 * | 7/2010 | Hess | H01L 21/56 257/684 |
| 8,026,589 B1 * | 9/2011 | Kim | H01L 21/568 257/686 |
| 2003/0122265 A1 * | 7/2003 | Baldonado | H01L 24/49 257/784 |
| 2009/0108425 A1 * | 4/2009 | Lee | H01L 23/3128 257/679 |
| 2009/0209064 A1 * | 8/2009 | Nonahasitthichai | H01L 21/561 438/110 |
| 2010/0090323 A1 * | 4/2010 | Shinoda | H01L 25/0657 257/686 |
| 2010/0289128 A1 * | 11/2010 | Camacho | H01L 23/4951 257/670 |
| 2011/0068481 A1 * | 3/2011 | Park | H01L 23/3128 257/777 |
| 2012/0074586 A1 * | 3/2012 | Seo | H01L 25/117 257/774 |
| 2013/0249106 A1 | 9/2013 | Lin et al. | |
| 2014/0167262 A1 * | 6/2014 | Yap | H01L 21/485 257/738 |

\* cited by examiner

PACKAGE-ON-PACKAGE TYPE STACK PACKAGE AND METHOD FOR MANUFACTURING THE SAME

CROSS-REFERENCE TO RELATED APPLICATION

The present application claims priority under 35 U.S.C. §119(a) to Korean Patent Application No. 10-2015-0017066, filed on Feb. 4, 2015, in the Korean Intellectual Property Office, which is incorporated herein by reference in its entirety.

BACKGROUND

1. Technical Field

Various embodiments generally relate to a semiconductor package, and more particularly, to a package-on-package type stack package which is realized by stacking packages, and a method for manufacturing the same.

2. Related Art

As electronic products are gradually downsized and highly functionalized, semiconductor chips with high capacity are needed to satisfy desired functions, and thus, it is necessary to mount an increased number of semiconductor chips on a small-sized electronic product. In this regard, technologies for manufacturing semiconductor chips with high capacity or mounting an increased number of semiconductor chips in a limited space cannot help but have limitations.

A recent trend is directed to embedding an increased number of semiconductor chips in one package or stacking two or more semiconductor chips. Under this situation, various technologies for improving electrical characteristics without increasing the overall thickness of a package even though one or more semiconductor chips are embedded or two or more packages are stacked are being developed.

SUMMARY

In an embodiment, a stack package may include a bottom package having a first semiconductor chip and first connection members; and a top package disposed over the bottom package, and having a second semiconductor chip and second connection members which are electrically coupled with the first connection members. The bottom package includes an interposer having a plurality of electrodes arranged along edges of an upper surface. The bottom package also includes a plurality of first bond fingers arranged by being separated from the edges of the interposer. The bottom package also includes a first semiconductor chip disposed over an upper surface of the interposer to expose the electrodes, and having a plurality of first bonding pads arranged over an other upper surface. The bottom package also includes first bonding wires electrically coupling the first bonding pads and the electrodes. The bottom package also includes second bonding wires electrically coupling the electrodes and the first bond fingers. The bottom package also includes a first encapsulation member formed to cover the first bond fingers, the upper surfaces and side surfaces of the interposer and the first semiconductor chip, and the first and second bonding wires, and having via holes which expose portions of the second bonding wires.

In an embodiment, a method for manufacturing a stack package may include preparing a bottom package which has a first semiconductor chip and first connection members, and a top package which has a second semiconductor chip and second connection members; and stacking the top package over the bottom package such that the first connection members and the second connection members are interconnected. Further, the preparing of the bottom package includes preparing a temporary substrate which has a plurality of first bond fingers arranged over an upper surface. The preparing of the bottom package also includes disposing an interposer which has a plurality of electrodes arranged over an upper surface thereof, over the upper surface of the temporary substrate, such that the first bond fingers are exposed. The preparing of the bottom package also includes disposing a first semiconductor chip which has a plurality of first bonding pads arranged over an upper surface thereof, over the upper surface of the interposer, such that the plurality of electrodes are exposed. The preparing of the bottom package also includes forming first bonding wires which interconnect the first bonding pads and the electrodes and second bonding wires which interconnect the plurality of electrodes and the first bond fingers. The preparing of the bottom package also includes forming a first encapsulation member over the upper surface of the temporary substrate to cover the first and second bonding wires, the interposer and the first semiconductor chip. The preparing of the bottom package also includes forming via holes which expose portions of the second bonding wires, in the first encapsulation member. Further, the preparing of the bottom package includes removing the temporary substrate. The preparing of the bottom package also includes forming the first connection members in the respective via holes to be electrically coupled with the second bonding wires.

DETAILED DESCRIPTION

Hereinafter, a package-on-package type stack package and a method for manufacturing the same will be described below with reference to the accompanying figures through various examples of embodiments. Various embodiments are directed to a package-on-package type stack package which realizes a low profile of a bottom package and thus decreases an overall thickness, and a method for manufacturing the same.

Figure 1:
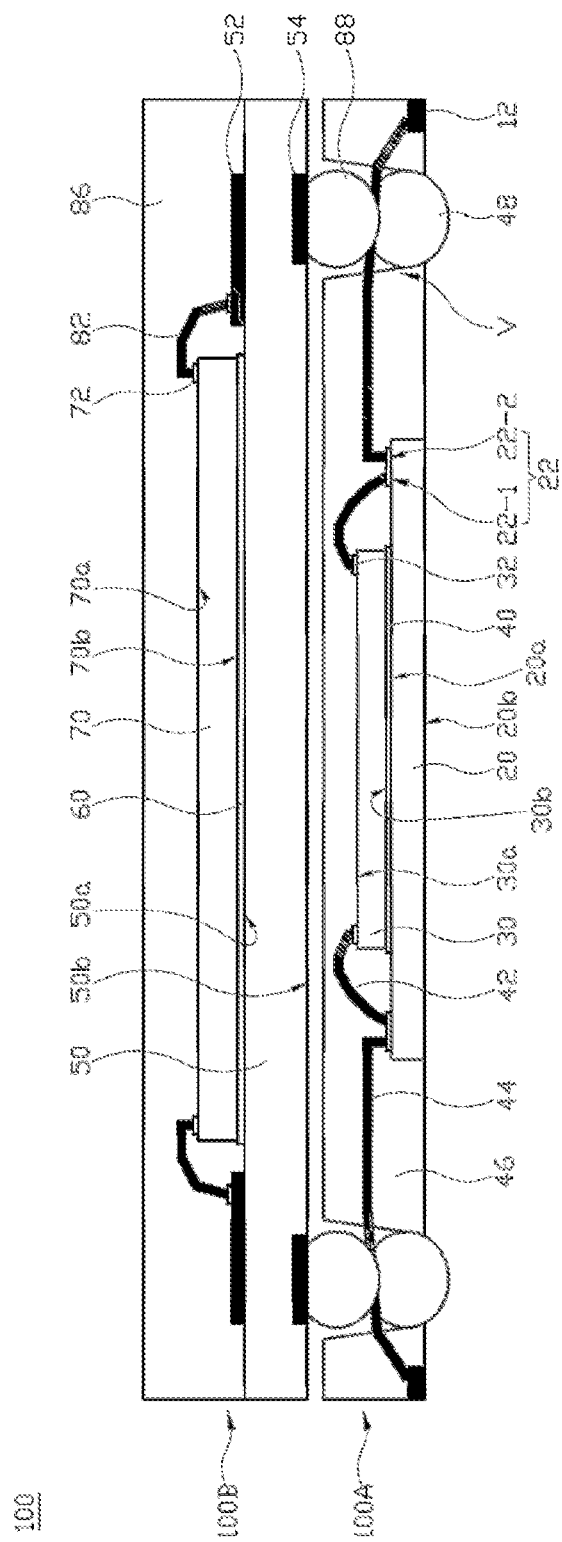
FIG. 1 is a cross-sectional view illustrating a package-on-package type stack package in accordance with an embodiment.

Referring to FIG. 1, a package-on-package type stack package 100 in accordance with an embodiment may include a bottom package 100A and a top package 100B stacked on the bottom package 100A.

In an embodiment, the bottom package 100A may be constructed without a substrate. The bottom package 100A may also include first bond fingers 12, an interposer 20, a first semiconductor chip 30, bonding wires 42 and 44, a first encapsulation member 46, and first connection members 48. In addition, the bottom package 100A may further include a first adhesive member 40 interposed between the interposer 20 and the first semiconductor chip 30.

Figure 2:
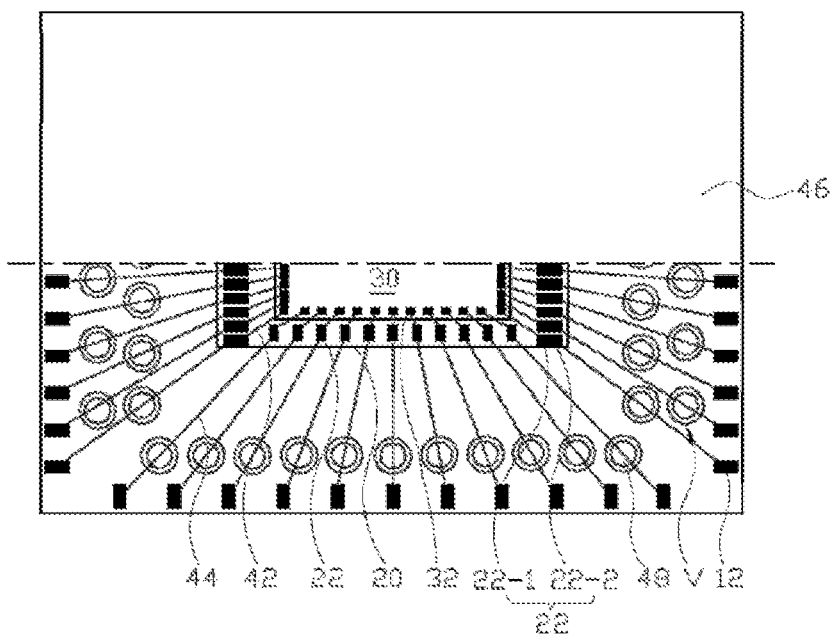
FIG. 2 is a plan view illustrating a bottom package in a state in which a first encapsulation member is partially removed in the package-on-package type stack package in accordance with an embodiment.

The first bond fingers 12 may be formed as patterns of a conductive material such as a metal. A plurality of first bond fingers 12 may be arranged in such a way as to be separated by a predetermined distance from the edges of the interposer 20. For example, when the interposer 20 has a quadrangular plate shape as shown in FIG. 2, the first bond fingers 12 may be arranged at regular intervals to surround the four edges of the interposer 20. Alternatively, while not shown, a plurality of first bond fingers 12 may be arranged adjacent to only both opposite edges of the interposer 20.

The first bond fingers 12 may have a size that may be electrically coupled by the second bonding wires 44. The first bond fingers 12 may be arranged separately from the four edges of the interposer 20 at regular intervals that allow via holes v for exposing portions of the second bonding wires 44 to be sufficiently formed in the first encapsulation member 46.

The interposer 20 as a connection medium between the first bond fingers 12 and the first semiconductor chip 30 may have a substantially quadrangular plate shape. The interposer 20 having such a quadrangular plate shape has an upper surface 20a and a lower surface 20b. The interposer 20 may also include a plurality of electrodes 22 arranged along the four edges of the upper surface 20a by a number corresponding to at least the first bond fingers 12. The electrodes 22 may be disposed on the upper surface 20a of the interposer 20. Alternatively, the electrodes 22 may be disposed to have shapes embedded in the interposer 20 and one surface thereof is exposed on the upper surface 20a of the interposer 20. The electrodes 22 may include one ends 22-1 disposed adjacent to the first semiconductor chip 30 and the other ends 22-2 which extend from the one ends 22-1 toward the edges of the interposer 20.

The first semiconductor chip 30 may be a logic chip. Alternatively, the first semiconductor chip 30 may be a memory chip. The first semiconductor chip 30 may be formed into a quadrangular plate shape which has an upper surface 30a and a lower surface 30b facing away from the upper surface 30a. The first semiconductor chip 30 may include a plurality of first bonding pads 32 arranged along the four edges of the upper surface 30a. Alternatively, where the electrodes 22 are arranged along only both opposite edges of the upper surface 20a of the interposer 20, the first bonding pads 32 may be arranged along only both edges of the upper surface 30a of the first semiconductor chip 30 adjacent to the electrodes 22. Such a first semiconductor chip 30 may be disposed in a face-up manner on the center portion of the upper surface 20a of the interposer 20 such that the lower surface 30b of the first semiconductor chip 30 faces the upper surface 20a of the interposer 20 and exposes the electrodes 22. The first semiconductor chip 30 may be fixed to the center portion of the upper surface 20a of the interposer 20 by the medium of the first adhesive member 40.

The first bonding wires 42 may be formed through a wire bonding process to interconnect the first bonding pads 32 of the first semiconductor chip 30 and the one ends 22-1 of the electrodes 22 of the interposer 20 disposed adjacent to the first bonding pads 32. The second bonding wires 44 may be formed through a wire bonding process to interconnect the other ends 22-2 of the electrodes 22 of the interposer 20 to which the first bonding wires 42 are electrically coupled and the first bond fingers 12 disposed in correspondence to the other ends 22-2 of the electrodes 22.

The first encapsulation member 46 is formed to protect the first semiconductor chip 30 from an external influence. The first encapsulation member 46 may be made of, for example, an EMC (epoxy molding compound). Such a first encapsulation member 46 may be formed to cover the first bond fingers 12, the upper surfaces 20a and 30a and the side surfaces of interposer 20 and the first semiconductor chip 30, and the first and second bonding wires 42 and 44. Further, the first encapsulation member 46 may include a plurality of through-mold vias (TMV), or, via holes v, formed to respectively expose portions of the second bonding wires 44.

In an embodiment, the via holes v may be formed into a shape which has a lower diameter smaller than an upper diameter, as shown in FIG. 1. It may be understood that this is to allow the first connection members 48 constructed by solder balls to be stably inserted into and installed in the via holes v. Alternatively, while not shown, the via holes v may be formed in such a manner that the top end and the bottom end of each via hole v have the same diameter. The via holes v may be formed to be arranged in a zigzag pattern as shown in FIG. 2.

The first connection members 48 are formed to electrically couple the top package 100B and an external circuit. The first connection members 48 may be constructed by, for example, solder balls. The first connection members 48 constructed by solder balls are respectively inserted into the via holes v. The first connection members 48 may be electrically coupled with the exposed portions of the second bonding wires 44 in the respective via holes v. The solder balls which construct the first connection members 48 may be formed to have a diameter that is smaller than the top diameter of the via holes v and larger than the bottom diameter of the via holes v, for example. According to this fact, the first connection members 48 constructed by solder balls are positioned in the lower portions of the respective via holes v. In particular, portions of the first connection members 48 project downward out of the via holes v, that is, downward out of the bottom surface of the bottom package 100A, such that the first connection members 48 may be easily connected with the external circuit.

Although it was illustrated and described above that the first bond fingers 12, the electrodes 22 and the first bonding pads 32 are arranged along four edges, the first bond fingers 12, the electrodes 22 and the first bonding pads 32 may be formed to be arranged along both opposite edges.

The top package 100B according to an embodiment may include a substrate 50, a second semiconductor chip 70, third bonding wires 82, a second encapsulation member 86, and second connection members 88. In addition, the top package 100B may further include a second adhesive member 60 interposed between the substrate 50 and the second semiconductor chip 70.

The substrate 50 may be a printed circuit board, and has a substantially quadrangular plate shape. The substrate 50 has an upper surface 50a and a lower surface 50b which faces away from the upper surface 50a. The substrate 50 may also include a plurality of second bond fingers 52 arranged along the edges of the upper surface 50a and a plurality of external electrodes 54 arranged on the lower surface 50b. The second bond fingers 52 and the external electrodes 54 may be electrically intercoupled by via patterns formed in the substrate 50. The second bond fingers 52 are arranged along the edges of the upper surface 50a of the substrate 50. When the substrate 50 has a quadrangular plate shape, the second bond fingers 52 may be arranged along both opposite edges of the substrate 50, and alternatively, may be arranged along the four edges of the substrate 50.

The second semiconductor chip 70 may be formed into a quadrangular plate shape which has an upper surface 70a. The second semiconductor chip 70 also has a lower surface 70b facing away from the upper surface 70a. The second semiconductor chip 70 may be attached to the upper surface 50a of the substrate 50 by the medium of the second adhesive member 60. The second semiconductor chip 70 is disposed in such a manner that the lower surface 70b thereof faces the upper surface 50a of the substrate 50. In particular, the second semiconductor chip 70 may be disposed on the center portion of the upper surface 50a of the substrate 50 such that the second bond fingers 52 are exposed.

In an embodiment, the second semiconductor chip 70 may be a memory chip. Alternatively, the second semiconductor chip 70 may be a logic chip.

The second semiconductor chip 70 may include a plurality of second bonding pads 72 arranged along the edges of the upper surface 70a. The second bonding pads 72 may be arranged by a number corresponding to at least the second bond fingers 52. Similarly to the second bond fingers 52, the second bonding pads 72 may be arranged along both opposite edges of the upper surface 70a of the second semiconductor chip 70. Further, alternatively, the second bonding pads 72 may be arranged along the four edges of the upper surface 70a of the second semiconductor chip 70.

The third bonding wires 82 may be formed through a wire bonding process to interconnect the second bond fingers 52 of the substrate 50 and the second bonding pads 72 of the second semiconductor chip 70 which correspond to each other.

The second encapsulation member 86 is formed to protect the second semiconductor chip 70 from an external influence. The second encapsulation member 86 may be made of, for example, an EMC. Such a second encapsulation member 86 may be formed on the upper surface 50a of the substrate 50 to cover the second semiconductor chip 70 and the third bonding wires 82.

The second connection members 88 may be formed on the external electrodes 54 arranged on the lower surface 50b of the substrate 50. Such second connection members 88 may be constructed by solder balls. In the stack structure with the bottom packages 100A, the second connection members 88 may be respectively inserted into the via holes v of the bottom package 100A. The second connection members 88 also may be electrically coupled with the first connection members 48 constructed by solder balls. The solder balls which construct the second connection members 88 may be formed to have a diameter smaller than the diameter of the top ends of the via holes v of the bottom package 100A such that the solder balls may be inserted into the via holes v. In an embodiment, by controlling the diameter of the second connection members 88 which are constructed by solder balls, the interval between the bottom package 100A and the top package 100B may be controlled. As a result, the overall thickness of the stack package 100 in accordance with an embodiment may be controlled.

Alternatively, the second connection members 88 may be constructed by solder pastes. Even in this case, the second connection members 88 constructed by solder pastes may be respectively inserted into the via holes v of the bottom package 100A. Further, the second connection members 88 may be electrically coupled with the first connection members 48.

While the top package 100B having the above-described structure was illustrated and explained in an embodiment, the top package 100B in the stack package 100 in accordance with an embodiment may be applied with various structures in addition to the above-described structure. For example, the top package 100B may be a flip chip package mounted to a substrate through flip chip bonding by forming bumps on a semiconductor chip.

The bottom package 100A and the top package 100B in accordance with an embodiment, constructed as mentioned above, construct the package-on-package type stack package 100 due to the fact that the second connection members 88 of the top package 100B are inserted into the via holes v of the bottom package 100A and are electrically coupled with the first connection members 48.

Accordingly, the package-on-package type stack package 100 in accordance with an embodiment has a low profile due to the fact that the bottom package 100A is constructed without a substrate. Further, the overall thickness of the package-on-package type stack package 100 may be decreased due to the fact that the second connection members 88 of the top package 100B are inserted into the via holes v of the bottom package 100A. As a consequence, the package-on-package type stack package 100 has a substantially low profile.

As shown in FIG. 1, the package-on-package type stack package 100 in accordance with an embodiment has a low profile due to the fact that the bottom package 100A is constructed without a substrate. The package-on-package type stack package 100 has a structure in which the second connection members 88 of the top package 100B are disposed by being inserted into the via holes v of the bottom package 100A.

Therefore, the package-on-package type stack package 100 in accordance with an embodiment is decreased in overall thickness and has a thin profile.

Hereinbelow, methods for manufacturing the bottom package, the top package, and a method for manufacturing the package-on-package type stack package in accordance with an embodiment will be described.

First, the bottom package 100A may be manufactured in the following order.

Figure 3:
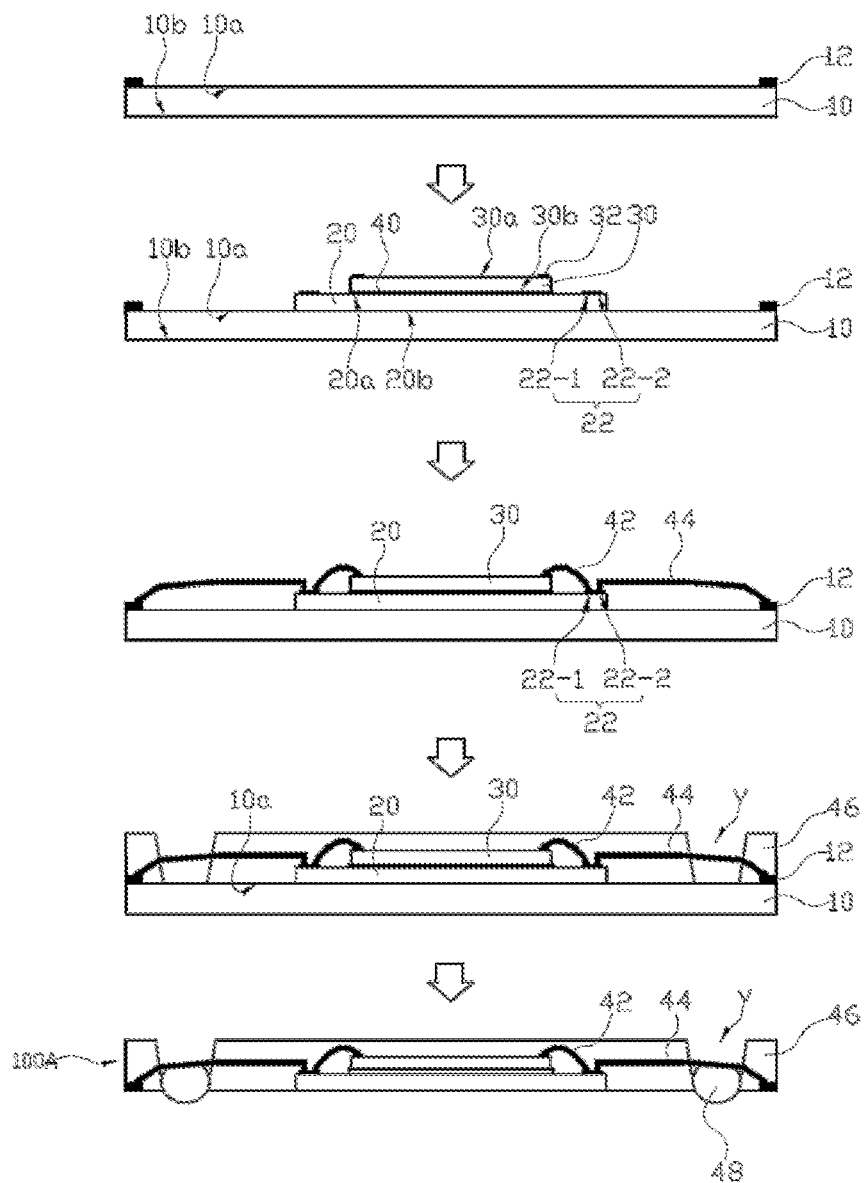
FIG. 3 is of cross-sectional views explaining a method for manufacturing the bottom package of the package-on-package type stack package in accordance with an embodiment.

Referring to FIG. 3, a temporary substrate 10 is prepared. As the temporary substrate 10, a carrier tape or a mount tape may be applied. The temporary substrate 10 has an upper surface 10a and a lower surface 10b which faces away from the upper surface 10a. For example, by sequentially performing a conductive layer forming process and an etching process for a formed conductive layer, a plurality of first bond fingers 12 are formed on the upper surface 10a of the temporary substrate 10. The first bond fingers 12 are formed to be arranged in a type surrounding the four edges of an interposer 20 which is to be subsequently disposed on the upper surface 10a of the temporary substrate 10 and has a quadrangular plate shape.

The interposer 20 which has a substantially quadrangular plate shape is attached to the upper surface 10a of the temporary substrate 10. The interposer 20 has an upper surface 20a and a lower surface 20b which faces away from the upper surface 20a. The interposer 20 may also include a plurality of electrodes 22 arranged along the edges of the upper surface 20a. Such an interposer 20 may be disposed in such a manner that the lower surface 20b thereof faces the temporary substrate 10 and exposes the first bond fingers 12. The electrodes 22 may include one ends 22-1 and the other ends 22-2. A first semiconductor chip 30 which has a substantially quadrangular plate shape is attached to the upper surface 20a of the interposer 20. As described above, the first semiconductor chip 30 may be a logic chip, may have an upper surface 30a and a lower surface 30b which faces away from the upper surface 30a, and may include a plurality of first bonding pads 32 which are arranged along the edges of the upper surface 30a. Such a first semiconductor chip 30 may be attached in a face-up manner to the center portion of the upper surface 20a of the interposer 20 by the medium of a first adhesive member 40 to expose the electrodes 22. Alternatively, the first semiconductor chip 30 may be a memory chip.

Through wire bonding processes, first bonding wires 42, which interconnect the first bonding pads 32 of the first semiconductor chip 30 and the one ends 22-1 of the electrodes 22 of the interposer 20 arranged adjacent to each other, are formed. Further, second bonding wires 44, which interconnect the other ends 22-2 of the electrodes 22 of the interposer 20 and the first bond fingers 12 arranged adjacent to each other, are formed.

The wire bonding processes for forming the first and second bonding wires 42 and 44 may be performed in such a manner that, after the first bonding wires 42 are first formed, the second bonding wires 44 are then formed. In the alternative, the wire bonding process for the first and second bonding wires 42 and 44 may be performed such that, after the second bonding wires 44 are first formed, the first bonding wires 42 are then formed. Moreover, the wire bonding processes may be performed in such a manner that, after a first bonding wire 42 and a second bonding wire 44 are sequentially formed for one first bond finger 12, one electrode 22 and one first bonding pad 32, first bonding wires 42 and second bonding wires 44 are continuously and sequentially formed in the same way, for the remaining first bond fingers 12, the remaining electrodes 22 and the remaining first bonding pads 32.

A first encapsulation member 46 is formed on the upper surface 10a of the temporary substrate 10 to cover the first semiconductor chip 30 and the first and second bonding wires 42 and 44. The first encapsulation member 46 may be, for example, an EMC (epoxy molding compound). The first encapsulation member 46 may be formed to have a minimum thickness in consideration of the thickness of a bottom package 100A to be formed. Through-mold vias (TMV), that is, via holes v which expose portions of the second bonding wires 44, are formed in the first encapsulation member 46. The forming of the via holes v may be performed through a laser drilling process or photolithographic and etching processes.

The temporary substrate 10 is removed from a resultant structure formed with the first encapsulation member 46 and the via holes v. Then, by inserting spherical solder balls into the respective via holes v and then performing reflow for the solder balls, first connection members 48, inserted into and disposed in the respective via holes v, are electrically coupled with the portions of the second bonding wires 44 exposed through the via holes v and are constructed by the solder balls, are formed. As a result, the manufacture of the bottom package 100A is completed.

The solder balls which construct the first connection members 48 are positioned in the lower portions of the respective via holes v. In particular, portions of the solder balls project downward out of the bottom surface of the bottom package 100A.

Although a scheme, in which the first connection members 48 constructed by solder balls are formed after removing the temporary substrate 10, was applied above in an embodiment, it is to be noted that, conversely, it is possible to apply a scheme in which the temporary substrate 10 is removed after forming the first connection members 48.

Next, the top package 100B may be manufactured in the following order.

Figure 4:
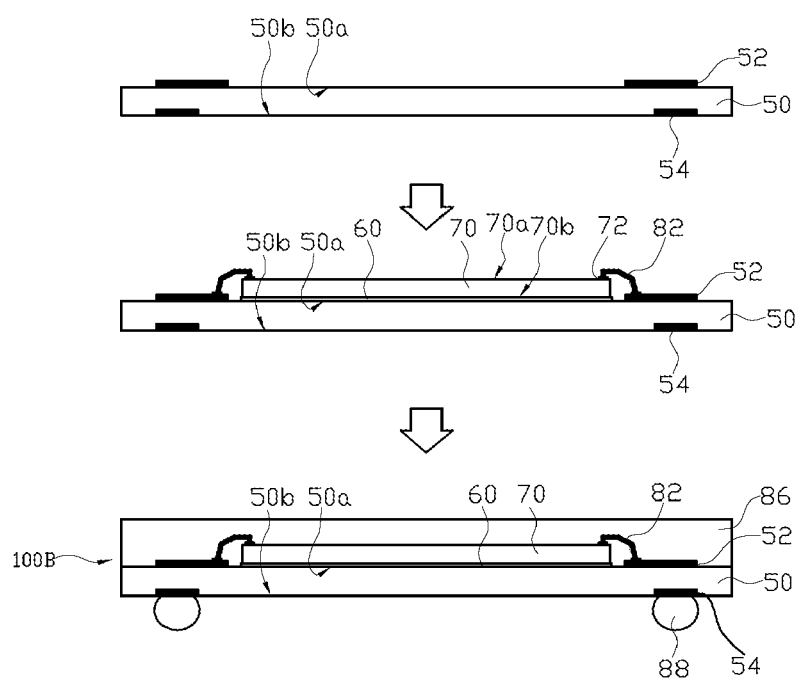
FIG. 4 is of cross-sectional views explaining a method for manufacturing the top package of the package-on-package type stack package in accordance with an embodiment.

Referring to FIG. 4, a substrate 50, in which second bond fingers 52 are arranged on an upper surface 50a and external electrodes 54 are arranged on a lower surface 50b, is prepared. As described above, the substrate 50 may be a printed circuit board, and may have a substantially quadrangular plate shape. A plurality of second bond fingers 52 may be disposed along both opposite edges or the four edges of the upper surface 50a of the substrate 50.

A second semiconductor chip 70 is attached to the upper surface 50a of the substrate 50 by the medium of a second adhesive member 60. The second semiconductor chip 70 may be a memory chip. The second semiconductor chip 70 may have a substantially quadrangular plate shape while having a size smaller than the substrate 50. The second semiconductor chip 70 includes a plurality of second bonding pads 72 arranged along the edges of an upper surface 70a thereof. The second semiconductor chip 70 may be disposed in a face-up manner such that a lower surface 70b thereof faces the upper surface 50a of the substrate 50, and, in particular, the second bond fingers 52 are exposed. The second semiconductor chip 70 may be a logic chip. Through a wire bonding process, third bonding wires 82, which interconnect the second bonding pads 72 of the second semiconductor chip 70 and the second bond fingers 52 of the substrate 50 disposed adjacent to each other are formed.

A second encapsulation member 86 is formed on the upper surface 50a of the substrate 50 to cover the second semiconductor chip 70 and the third bonding wires 82. The second encapsulation member 86 may be formed of, for example, an EMC. Second connection members 88, which are constructed by, for example, solder balls are respectively formed on the external electrodes 54 arranged on the lower surface 50b of the substrate 50. Further, through this, the manufacture of the top package 100B is completed. The forming of the second connection members 88 constructed by solder balls may be implemented by, for example, placing respective solder balls on the external electrodes 54 and then reflowing the solder balls.

Figure 5:
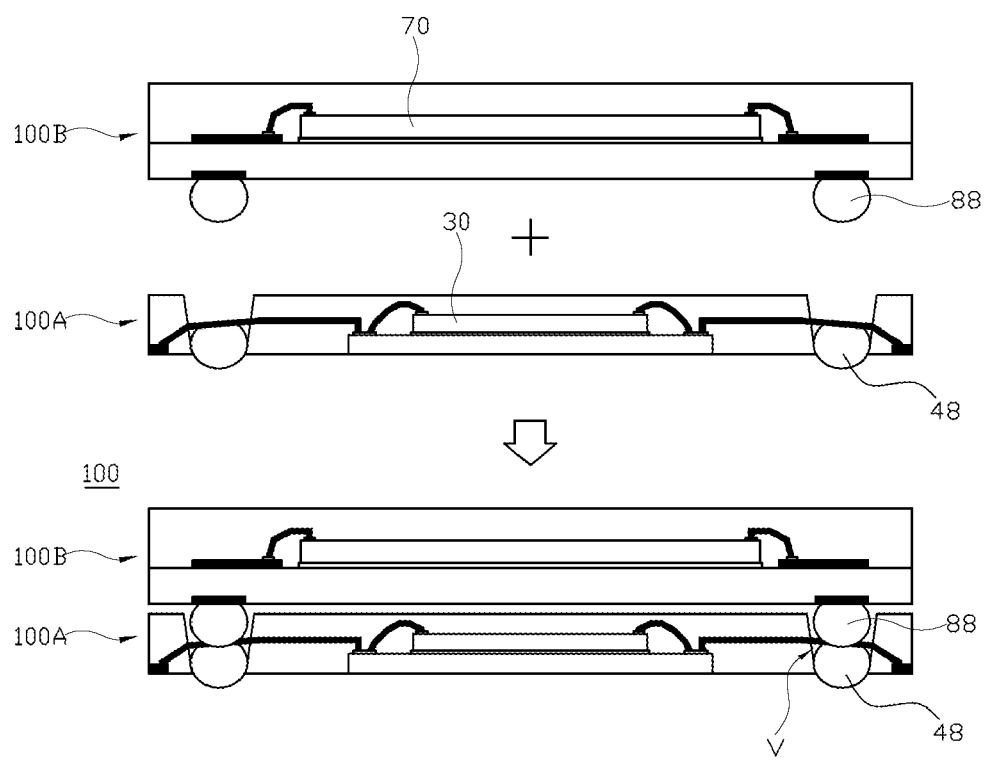
FIG. 5 is of cross-sectional views explaining a method for manufacturing the package-on-package type stack package in accordance with an embodiment.

Referring to FIG. 5, after the bottom package 100A and the top package 100B are manufactured through the above-described manufacturing processes, by stacking the top package 100B on the bottom package 100A such that the first connection members 48 and the second connection members 88 are interconnected, the package-on-package type stack package 100 in accordance with an embodiment may be manufactured.

The stacking of the top package 100B may be implemented as the second connection members 88 constructed by solder balls are inserted into the via holes v of the bottom package 100A and are electrically and physically coupled with the first connection members 48 of the bottom package 100A constructed by solder balls, in the via holes v.

The above-described package-on-package type stack package may be applied to various kinds of semiconductor devices and package modules having the same.

Figure 6:
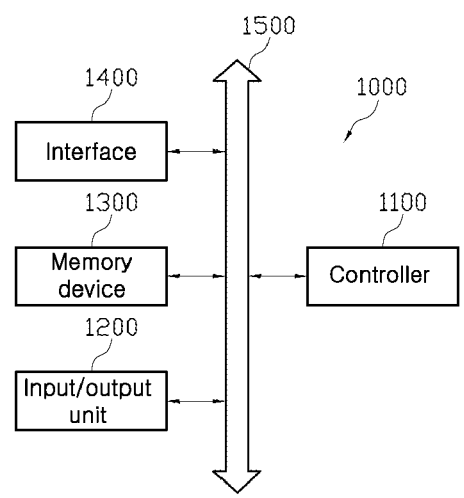
FIG. 6 is a block diagram illustrating a representation of an example of an electronic system to which the package-on-package type stack package in accordance with an embodiment is applied.

Referring to FIG. 6, a block diagram illustrating a representation of an example of an electronic system to which the package-on-package type stack package in accordance with an embodiment is described. As shown in the figure, an electronic system 1000 may include a controller 1100, an input/output unit 1200, and a memory device 1300. The controller 1100, the input/output unit 1200 and the memory device 1300 may be electrically coupled with one another through a bus 1500 which provides data movement paths.

For example, the controller 1100 may include at least any one of a microprocessor, a digital signal processor, a microcontroller, and logic devices capable of performing similar functions to these components. The controller 1100 and the memory device 1300 may include the stack package in accordance with an embodiment. The input/output unit 1200 may include at least one selected among a keypad, a keyboard, a display device, and so forth.

The memory device 1300 may store data and/or commands to be executed by the controller 1100. The memory device 1300 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this case, the electronic system 1000 may stably store a large amount of data in a flash memory system.

Such an electronic system 1000 may further include an interface 1400 for transmitting data to a communication network or receiving data from a communication network. The interface 1400 may be a wired or wireless type. For example, the interface 1400 may include an antenna or a wired/wireless transceiver.

The electronic system 1000 may further include an application chipset, a camera image processor (CIP), and so forth.

The electronic system 1000 may be realized as a mobile system, a personal computer, a computer for an industrial use or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

Where the electronic system 1000 is equipment capable of performing wireless communication, the electronic system 1000 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution) and Wibro (wireless broadband Internet).

Figure 7:
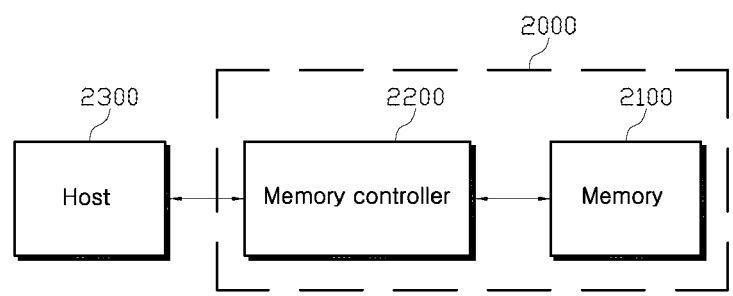
FIG. 7 is a block diagram illustrating a representation of an example of a memory card which includes the package-on-package type stack package in accordance with an embodiment.

Referring to FIG. 7, a block diagram illustrating a representation of an example of a memory card which includes the package-on-package type stack package in accordance with an embodiment is described. As shown in the figure, the stack package in accordance with an embodiment may be provided in the form of a memory card 2000. For instance, the memory card 2000 may include a memory 2100 such as a nonvolatile memory device and a memory controller 2200. The memory 2100 and the memory controller 2200 may store data or read stored data.

The memory 2100 may include at least any one among nonvolatile memory devices to which the stack package in accordance with an embodiment is applied. The memory controller 2200 may control the memory 2100 to read stored data or store data in response to a read/write request from a host 2300.

While various embodiments have been described above, it will be understood to those skilled in the art that the embodiments described are by way of examples only. Accordingly, the package-on-package type stack package and the method for manufacturing the same described should not be limited based on the described embodiments above.

What is claimed is:

1. A stack package comprising:
    a bottom package having a first semiconductor chip and first connection members; and
    a top package disposed over the bottom package, and having a second semiconductor chip and second connection members electrically coupled with the first connection members,
    the bottom package comprising:
        an interposer having a plurality of electrodes arranged along edges of an upper surface of the interposer;
        a plurality of first bond fingers arranged by being separated from the edges of the interposer, the first bond fingers being arranged in a same plane as the interposer;
        the first semiconductor chip disposed over the upper surface of the interposer while leaving the electrodes uncovered by the first semiconductor chip, the first semiconductor chip having a plurality of first bonding pads arranged over an other upper surface, the other upper surface being an upper surface of the first semiconductor chip;
        first bonding wires electrically coupling the first bonding pads with the electrodes;
        second bonding wires electrically coupling the electrodes with the first bond fingers;
        a first encapsulation member formed to cover the first bond fingers, the upper surfaces and side surfaces of the interposer and the first semiconductor chip, and the first and second bonding wires, the first encapsulation member having via holes which, when a via hole is made, leave a portion of the second bonding wire bridging the via hole; and
        the first connection members inserted into the via holes such that the first connection members are positioned in lower portions in the via holes and portions of the first connection members project out of a bottom surface of the bottom package, each first connection member of the first connection members electrically coupling with the portion of the second bonding wire bridging the via hole.

2. The stack package according to claim 1, wherein the first semiconductor chip includes a logic chip, and the second semiconductor chip includes a memory chip.

3. The stack package according to claim 1, wherein, when the interposer and the first semiconductor chip have quadrangular plate shapes, the first bond fingers are arranged in a manner surrounding four edges of the interposer, and the electrodes and the first bonding pads are arranged along four edges of the upper surfaces of the interposer and the first semiconductor chip, respectively.

4. The stack package according to claim 1, wherein the via holes have a shape which has a lower diameter which is less than an upper diameter.

5. The stack package according to claim 1, wherein the first connection members comprise solder balls.

6. The stack package according to claim 5, wherein the solder balls have a diameter which is less than an upper diameter of the via holes and greater than a lower diameter of the via holes.

7. The stack package according to claim 1, wherein the second connection members are respectively inserted into the via holes of the bottom package, and are electrically coupled with the first connection members.

8. The stack package according to claim 7, wherein the top package comprises:
   a substrate having an upper surface and a lower surface which faces away from the upper surface, and including second bond fingers arranged over the upper surface and external electrodes arranged under and on the lower surface, are electrically coupled with the second bond fingers and are electrically coupled with the second connection members;
   the second semiconductor chip disposed over the upper surface of the substrate while leaving the second bond fingers uncovered by the second semiconductor chip, the semiconductor chip having a plurality of second bonding pads arranged over an upper surface of the second semiconductor chip;
   third bonding wires electrically coupling the second bonding pads with the second bond fingers; and
   a second encapsulation member formed over the upper surface of the substrate to cover the second semiconductor chip and the third bonding wires.

9. The stack package according to claim 7, wherein the second connection members comprise solder balls or solder pastes.

10. A method for manufacturing a stack package, comprising:
    preparing a bottom package which has a first semiconductor chip and first connection members, and a top package which has a second semiconductor chip and second connection members; and
    stacking the top package over the bottom package such that the first connection members and the second connection members are interconnected,
    wherein the preparing of the bottom package comprises:
      preparing a temporary substrate which has a plurality of first bond fingers arranged over an upper surface of the temporary substrate;
      disposing an interposer which has a plurality of electrodes arranged over an upper surface of the interposer, over the upper surface of the temporary substrate, such that the first bond fingers are exposed;
      disposing the first semiconductor chip which has a plurality of first bonding pads arranged over an upper surface of the first semiconductor chip, over the upper surface of the interposer, such that the plurality of electrodes are not covered by the first semiconductor chip;
      forming first bonding wires which interconnect the first bonding pads with the plurality of electrodes and second bonding wires which interconnect the electrodes with the first bond fingers;
      forming a first encapsulation member over the upper surface of the temporary substrate to cover the first and second bonding wires, the interposer and the first semiconductor chip;
      forming via holes which leave a portion of the second bonding wire in each via hole, bridging the via hole, in the first encapsulation member;
      removing the temporary substrate, wherein the first bond fingers and the interposer are disposed in a same plane; and
      forming the first connection members in the respective via holes to be electrically coupled with the portion of the second bonding wire bridging the via hole, the first connection members positioned in lower portions of the via holes, portions of the first connection members projecting out of a bottom surface of the bottom package.

11. The method according to claim 10, wherein the first semiconductor chip comprises a logic chip, and the second semiconductor chip comprises a memory chip.

12. The method according to claim 10, wherein, when the temporary substrate, the interposer and the first semiconductor chip have quadrangular plate shapes, the first bond fingers, the electrodes and the first bonding pads are formed to be arranged along four edges of the upper surfaces of the temporary substrate, the interposer and the first semiconductor chip, respectively.

13. The method according to claim 10, wherein the first connection members comprise solder balls.

14. The method according to claim 10, wherein the stacking of the top package over the bottom package is performed such that the second connection members of the top package are inserted into the via holes of the bottom package and are electrically coupled with the first connection members.

15. The method according to claim 10, wherein the forming of the first bonding wires and the second bonding wires is performed in any one of:
    a first scheme in which, after the first bonding wires which interconnect the first bonding pads with the plurality of electrodes are formed, the second bonding wires which interconnect the electrodes with the first bond fingers are formed;
    a second scheme in which, after the second bonding wires which interconnect the first bond fingers with the electrodes are formed, the first bonding wires which interconnect the electrodes with the first bonding pads are formed; and
    a third scheme in which, after first and second bonding wires which interconnect one first bond finger, one electrode and one first bonding pad are formed, first bonding wires and second bonding wires are continuously formed for remaining first bond fingers, remaining electrodes and remaining first bonding pads.

16. The method according to claim 10, wherein the preparing of the top package comprises:
    attaching the second semiconductor chip which has a plurality of second bonding pads over an upper surface of the second semiconductor chip, to an upper surface of a substrate which has second bond fingers arranged over the upper surface of the substrate and external electrodes arranged under and on a lower surface of the substrate, such that the second bond fingers are exposed;
    forming third bonding wires which interconnect the second bonding pads with the second bond fingers;

forming a second encapsulation member over the upper surface of the substrate to cover the second semiconductor chip and the third bonding wires; and attaching the second connection members to the external electrodes on the lower surface of the substrate.

17. The method according to claim 16, wherein the second connection members comprise solder balls or solder pastes.

\* \* \* \* \*